United States Patent [19]

Dallavalle et al.

[11] Patent Number: 5,606,625
[45] Date of Patent: Feb. 25, 1997

[54] DIGITAL CIRCUIT TO REGULATE THE GAIN OF AN AMPLIFIER STAGE

[75] Inventors: Carlo Dallavalle, Vimercate; Carlo Crippa, Merate; Pierangelo Confalonieri, Canonica Diadda, all of Italy

[73] Assignee: SGS-Thomson Microelectronics S.r.l., Agrate Brianza, Italy

[21] Appl. No.: 249,316

[22] Filed: May 26, 1994

[30] Foreign Application Priority Data

May 31, 1993 [EP] European Pat. Off. ........... 93830244.5

[51] Int. Cl.$^6$ ..................................................... H03G 3/00
[52] U.S. Cl. .......................... 381/107; 381/104; 330/278
[58] Field of Search .................................. 381/104, 107, 381/106, 108; 330/279, 278

[56] References Cited

U.S. PATENT DOCUMENTS 4,112,384  9/1978  Buchberger ............................. 381/107
4,947,133  8/1990  Thomas ................................... 381/107
5,029,162  7/1991  Epps .
5,134,631  7/1992  Kingston et al. .

FOREIGN PATENT DOCUMENTS 2926011  1/1981  Germany ....................... H03H 11/24
2180119  3/1987  United Kingdom .................... 381/107

*Primary Examiner*—Curtis Kuntz
*Assistant Examiner*—Minsun Oh
*Attorney, Agent, or Firm*—David M. Driscoll; James H. Morris

[57] ABSTRACT

A digital circuit for controlling the gain of an amplifier stage of a coded signal receiving channel is provided. The circuit includes a peak detector coupled to the input terminal of the receiving channel through a coded signal rectifying circuit and a gain control stage. The gain control stage includes a digital comparator having two input terminals respectively connected to an output terminal of the peak detector and to a memory, and an output terminal coupled to a gain control terminal of the amplifier stage. The address selectable contents of the memory contain predetermined peak values in coded form.

33 Claims, 1 Drawing Sheet

5,606,625

DIGITAL CIRCUIT TO REGULATE THE GAIN OF AN AMPLIFIER STAGE

BACKGROUND OF THE INVENTION

1. Field of the Invention

This invention relates generally to a digital circuit for controlling the gain of an amplifier stage. In particular, the invention concerns a circuit that is effective in preventing distortion phenomena due to clipping (i.e., dynamic saturation of an amplifier) in a receive channel for voice signals in digital form.

The field of application of the invention pertains, particularly but not exclusively, to digital telephone and cordless telephone equipment connected to integrated service digital networks. The description which follows makes reference to that field of application for simplicity of illustration only.

2. Discussion of the Related Art

In this type of communications network, analog voice signals are converted to digital signals by sampling. The digital signal, which for example may be coded with 8 bits, contains information as to both the amplitude (bits 7-1) and the sign (bit 0) of the sampled analog signal.

Digital telephone equipment of medium-high level using the PCM technique requires final amplifiers which can drive a speaker with sufficient power to allow "room" listening, even from a distance of a few meters from the telephone set. In general, the digital and analog circuits present in the signal path are designed to supply the speaker with the highest possible power at a low (e.g. <0.2%) distortion when the input is a maximum amplitude signal. However, it is unlikely that a voice signal can attain and retain for some time a level corresponding to the maximum amplitude envisaged. Thus, the level of a standard phone call may be found low even at the highest volume setting of the called set.

On the other hand, if both the digital and analog circuits present in the signal path are designed to provide maximum output power with low distortion at a medium level of the input signal—leaving it for the subscriber to select a lower sound volume—then a sufficiently high level of telephone talk can be obtained even with the speakerphone operated. At above-medium level of the input signal, however, distortion problems due to clipping are encountered. Thus, the channel ought to be provided with an anti-clipping circuit affording, when required, maximum output power and low distortion. To fill that demand, state-of-art proposals include approaches of the analog type and of the mixed analog-digital type, which both make ample use of external components. Such approaches involve, however, high power consumption and increased costs.

SUMMARY OF THE INVENTION

The foregoing problems are overcome in one illustrative embodiment of the invention in which a gain control circuit for an amplifier stage is provided which is fully digital and has such structural and functional features as to prevent the occurrence of signal distortion phenomena due to dynamic saturation of the amplifier stage of the receiving channel.

Another object of this invention is to avoid distortion phenomena even with the amplifier stage operated at full power.

The features and advantages of a circuit according to the invention will become apparent from the following description of an embodiment thereof, given by way of example and not of limitation with reference to the accompanying drawing.

DETAILED DESCRIPTION

Figure 1:
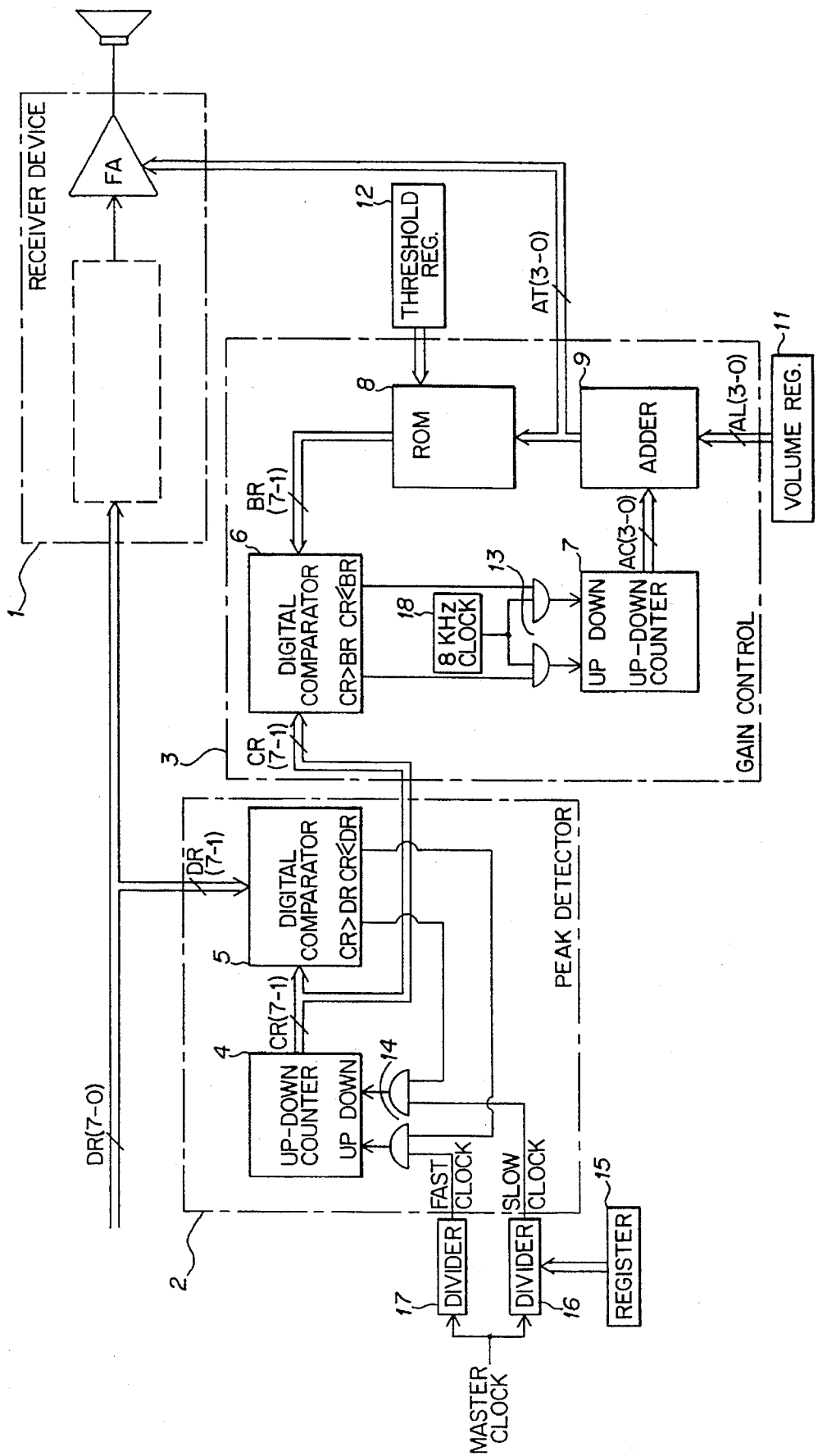
FIG. 1 is a schematic diagram of an amplifier stage embodying this invention, for a digital-coded signal receiving channel.

The digital control circuit, as shown in FIG. 1, consists of two main blocks: a digital peak detector 2 and a gain control stage 3.

The digital peak detector comprises a digital comparator 5 coupled to an up/down counter 4. The counter 4 has two inputs which are intended for up and down count selection, and are connected to two outputs of the digital comparator via two AND gates 14. The other inputs of the AND gates are respectively coupled to two clock signals identified as FAST CLOCK and SLOW CLOCK. The two signals output from the digital comparator are mutually complementary. The two inputs of the digital comparator are respectively coupled to the digitally rectified input signal and the up/down counter output. The clock signals 18 (i.e., FAST CLOCK and SLOW CLOCK) are issued by a divider pair 16 and 17; one of these dividers is programmable through a storage register 15, and they both receive as an input a common clock signal MASTER CLOCK.

The gain control stage 3 comprises a digital comparator 6 having two inputs that are respectively connected to the output of the up/down counter 4 in the first block and to the output of a read-only memory 8. This comparator has two outputs, for mutually complementary signals, which are coupled to two count select inputs of an up/down counter 7 via two AND gates 13. The other input of each AND gate 13 receives a clock signal. The counter output is connected to a first input of a digital adder 9. A second input of the adder is connected to a storage register 11, and its output is connected to the address select inputs of the read-only memory, and to a gain control input of the amplifier stage.

Variations in the amplifier stage gain can be obtained in a manner known to those skilled in the art by means of electronic switches connected in the negative feedback network of the amplifier stage.

The operation of the digital control circuit according to the invention will now be described. The input side of the digital control circuit is connected to the receiving channel input. A digital signal coded with 8 bits DR(7-0) is "rectified" by removing its sign bit. The remaining 7 bits DR(7-1) are input to the digital peak detector 2.

When the rectified digital input signal DR(7-1) is greater than or equal to the output signal CR(7-1) of the up/down counter appearing on the other comparator input, the up-count select input of the up/down counter is enabled through the logic AND gate connected to it, and the counter will increment its contents quite rapidly until CR(7-1) attains the same value as the digital input signal DR(7-1). On the contrary, when the digital input signal DR(7-1) is smaller than the signal present at the other comparator input, the counter is enabled to decrement its contents very slowly.

The up and down counting rates, which actually determine the "up" and "down" time constants of the peak detector, can be varied by merely selecting, through programmable dividers, different divisors for a system clock signal indicated as MASTER CLOCK in the drawing. In the preferred embodiment, the up-count rate is fixed and four different options are provided for the down-count rate.

The digital peak detector output is connected to the gain control stage 3, which will generate a digital code AT(3-0), of 4 bits in this example, effective to drive (through an appropriate decode circuit not shown) a certain number of electronic switches connected in the negative feedback network of the amplifier stage, thereby controlling the gain stage. The digital signal CR(7-1) is compared by the comparator 6 with the contents of the read-only storage cell 8, whose address is indicated by the signal AT(3-0). The contents of the storage cell represent the maximum admissible peak value when the final amplifier gain equals the gain setting performed by means of the digital code AT(3-0).

The code AT(3-0) is obtained by adding the output signal from the up/down counter 7 (designated AC(3-0) in FIG. 1) with the code designated AL(3-0) and corresponding to the volume setting performed by the subscriber through the register 11.

The outputs from the comparator 6 control the up/down counter 7 to decrement its contents when the peak value of the input signal exceeds the maximum admissible value, to avoid clipping, thereby lowering the amplifier gain, and to increment its contents when the peak value of the input signal is below the threshold value.

Using another register 12 connected to the inputs of the ROM, the threshold value for operation of the anti-clipping circuit can be selected from a predetermined range of values.

Thus, the circuit of this invention solves the technical problem and affords a number of advantages, a first of which is that a gain control circuit for an amplifier stage can be provided which is fully digital, and accordingly, easy to integrate monolithically without involving the provision of any external components. Another advantage comes from the improved inherent flexibility afforded by a digital approach over analog ones, whereby a desired setting can be obtained by appropriate programming, either by the subscriber himself or by the manufacturer of the telephone equipment.

It will be appreciated that many modifications, adaptations, integrations, changes, and replacements of elements with equivalents thereof may be made unto the embodiment described above by way of non-limitative example, without departing from the spirit of the invention.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A digital circuit for controlling the gain of an amplifier stage of a coded signal receiving channel having at least one signal input terminal, at least one gain control terminal of the amplifier stage, and at least one output terminal for coupling to an electroacoustic device, the digital circuit comprising:
   a digital peak detector coupled to the input terminal of the receiving channel through a coded signal rectifying circuit; and
   a gain control stage including;
      a memory containing coded peak values dependent on predetermined gain control values, the memory having an output;
      a first digital comparator having at least first and second input terminals respectively connected to an output terminal of said digital peak detector and to the memory output;
      first and second logic AND gate circuits, each having an input terminal connected to a clock signal generator and an output terminal;
      a first up/down counter having first and second count select input terminals that are respectively coupled to the output terminals of the first and second logic AND gate circuits, said first up/down counter having at least one output terminal coupled to at least one address select input terminal of the memory and to said gain control terminal of the amplifier stage.

2. A circuit according to claim 1, wherein the first digital comparator outputs complementary signals.

3. A circuit according to either claim 1 or 2, wherein the digital peak detector comprises a second digital comparator having at least first and second output terminals respectively coupled to first and second count select input terminals of a second up/down counter through third and fourth logic AND gate circuits, each having an input terminal respectively connected to second and third clock signal generators, said second digital comparator having at least first and second input terminals respectively connected to said coded signal rectifying circuit and to an output terminal of the second up/down counter.

4. A circuit according to claim 3, wherein the second comparator outputs complementary signals.

5. A circuit according to claim 4, wherein the second and third generators coupled to the second up/down counter generate clock signals at different frequencies from each other.

6. A circuit according to claim 5, wherein the clock signal generator coupled to the input terminal reserved for up-count selection of the second up/down counter generates clock signals having a higher frequency than the frequency of the clock signals generated by the generator coupled to the input terminal reserved for down-count selection.

7. A circuit according to claim 5, wherein at least one of said clock signal generators is driven by a programming circuit.

8. A circuit according to claim 3, wherein the second and third clock signal generators are dividers acting on a primary clock signal.

9. A circuit according to any of claims 1–2, wherein, connected between the first up/down counter and the memory, is a digital adder having at least one output terminal connected to at least one address select input terminal of the memory and to the gain control terminal of the amplifier stage, and having at least two input terminals respectively connected to at least one output terminal of the counter and to a storage register for coded values of sound volume.

10. A circuit according to claim 9, wherein at least some of the address select inputs of ROM are connected to a storage register for coded values of distortion threshold.

11. A gain control circuit for an amplifier stage of a signal receiving channel having at least one signal input terminal, at least one amplifier stage gain control terminal that receives a gain control signal and at least one output terminal for coupling to an electroacoustic device, the gain control circuit comprising:
   a peak detector coupled to the input terminal of the receiving channel through a rectifying circuit; and
   a gain control stage that generates the gain control signal including;

a reference circuit including a storage device which stores a plurality of predetermined reference signals, the reference circuit having an output at which one of the plurality of reference signals is provided;

a comparator having at least first and second input terminals respectively connected to an output terminal of the peak detector and to the output of the reference circuit; and at least one output terminal, coupled to the gain control terminal of the amplifier stage and to at least one control terminal of said reference circuit, that provides the gain control signal, the reference circuit supplying the comparator with one of the plurality of reference signals selected from the storage device according to a value of the gain control signal.

12. A digital circuit for controlling the gain of an amplifier stage of a signal receiver, the signal receiver having at least one input for receiving an input signal, at least one gain control input for receiving a gain setting for the amplifier stage, and at least one output, the digital circuit comprising:

a memory having at least one address input that is coupled to the at least one gain control input, the memory storing a value at each address location indicating a maximum allowable amplitude for the input signal when the gain setting has a value corresponding to the address of the location, the maximum allowable amplitude being chosen to prevent clipping of the amplifier output at the corresponding gain setting, the memory having at least one output for outputting the value stored at an addressed location;

a comparator that compares the at least one memory output with a peak signal representing the amplitude of the input signal and generates at least one output indicating which is larger; and a gain control circuit that generates a gain setting and sources it to the at least one gain control input, the gain control circuit being coupled to the comparator output and reducing the gain setting sourced to the amplifier when the peak signal exceeds the maximum allowable amplitude provided by the memory output.

13. A digital circuit as claimed in claim 12 wherein the gain control circuit increases the gain setting sourced to the amplifier when the maximum allowable amplitude provided by the memory output exceeds the peak signal.

14. A digital circuit as claimed in claim 12, including:

a storage element, coupled to the gain control circuit, that stores a value representing a minimum gain setting for the amplifier stage.

15. A digital circuit as claimed in claim 12 wherein the gain control circuit includes:

an up/down counter coupled to the comparator output so that the counter counts up when the input signal is less than the memory output and counts down when the input signal exceeds the memory output;

a storage element that stores and outputs a value representing a minimum gain setting for the amplifier stage; and an adder that adds the up/down counter output to the storage element output to generate the gain setting sourced to the gain control input.

16. A digital circuit as claimed in claim 15 wherein the up/down counter has an up control input to initiate counting up, and a down control input to initiate counting down, and wherein the comparator has a pair of complementary outputs that are respectively coupled to the up and down control inputs.

17. A digital circuit as claimed in claim 12 wherein the memory has first and second groups of address inputs, the first group of address inputs being coupled to the gain control input, and the second group of address inputs being coupled to a storage element for storing an address offset.

18. A digital circuit as claimed in claim 12 including a peak detection circuit for generating the peak signal, the peak detection circuit comprising:

an up/down counter and a second comparator, the second comparator being coupled to the input signal and an output of the up/down counter and generating at least one output indicating which is larger, the up/down counter being coupled to the at least one second comparator output so that it counts up when its output is less than the amplitude of the input signal and down when it is greater, the up/down counter output corresponding to the peak signal.

19. A circuit according to claim 1, wherein:

the second comparator outputs complementary signals; and the second and third clock signal generators are dividers acting on a primary clock signal.

20. A circuit according to claim 1, wherein:

the second and third clock signal generators are dividers acting on a primary clock signal; and the second and third generators coupled to the second up/down counter generate clock signals at different frequencies from each other.

21. A circuit according to claim 1, wherein:

the second and third clock signal generators are dividers acting on a primary clock signal; and the clock signal generator coupled to the input terminal reserved for up-count selection of the second up/down counter generates clock signals having a higher frequency than the frequency of the clock signals generated by the generator coupled to the input terminal reserved for down-count selection.

22. A circuit according to claim 1, wherein:

the second and third clock signal generators are dividers acting on a primary clock signal; and at least one of said clock signal generators is driven by a programming circuit.

23. A circuit according to claim 1, wherein:

the circuit further includes a digital adder connected between the first up/down counter and the memory, said digital adder having at least one output terminal connected to at least one address select input terminal of the memory and to the gain control terminal of the amplifier stage, and having at least two input terminals respectively connected to at least one output terminal of the counter and to a storage register for coded values of sound volume; and the second comparator outputs complementary signals.

24. A circuit according to claim 1, wherein:

the circuit further includes a digital adder connected between the first up/down counter and the memory, said digital adder having at least one output terminal connected to at least one address select input terminal of the memory and to the gain control terminal of the amplifier stage, and having at least two input terminals respectively connected to at least one output terminal of the counter and to a storage register for coded values of sound volume; and the second and third generators coupled to the second up/down counter generate clock signals at different frequencies from each other.

25. A circuit according to claim 1, wherein:
the circuit further includes a digital adder connected between the first up/down counter and the memory, said digital adder having at least one output terminal connected to at least one address select input terminal of the memory and to the gain control terminal of the amplifier stage, and having at least two input terminals respectively connected to at least one output terminal of the counter and to a storage register for coded values of sound volume; and the clock signal generator coupled to the input terminal reserved for up-count selection of the second up/down counter generates clock signals having a higher frequency than the frequency of the clock signals generated by the generator coupled to the input terminal reserved for down-count selection.

26. A circuit according to claim 1, wherein:
the circuit further includes a digital adder connected between the first up/down counter and the memory, said digital adder having at least one output terminal connected to at least one address select input terminal of the memory and to the gain control terminal of the amplifier stage, and having at least two input terminals respectively connected to at least one output terminal of the counter and to a storage register for coded values of sound volume; and at least one of said clock signal generators is driven by a programming circuit.

27. A circuit according to claim 1, wherein:
the circuit further includes a digital adder connected between the first up/down counter and the memory, said digital adder having at least one output terminal connected to at least one address select input terminal of the memory and to the gain control terminal of the amplifier stage, and having at least two input terminals respectively connected to at least one output terminal of the counter and to a storage register for coded values of sound volume; and the second and third clock signal generators are dividers acting on a primary clock signal.

28. A circuit according to claim 27, wherein at least some of the address select inputs of ROM are connected to a storage register for coded values of distortion threshold.

29. A system for generating an amplified signal, comprising:
an amplifier stage having a first input for receiving an input signal, a second input for receiving a gain control signal which controls a gain of the amplifier stage, and an output, the amplifier stage amplifying the input signal in accordance with the gain to generate the amplified signal at the output of the amplifier stage;

a peak detector having an input for receiving the input signal, and an output the peak detector generating a signal at the output of the peak detector that represents a peak amplitude of the input signal; and a gain control stage having an input coupled to the output of the peak detector, and an output coupled to the second input of the amplifier stage, the gain control stage generating the gain control signal based on the signal at the output of the peak detector; wherein the gain control stage further comprises:
a comparator having an input coupled to the output of the peak detector, and an output coupled to the output of the gain control stage, the comparator output providing a signal representing a result of a comparison between the output of the peak detector and a maximum permissible amplitude of the input signal for the gain of the amplifier stage.

30. A system for generating an amplified signal, comprising:
an amplifier stage having a first input for receiving an input signal, a second input for receiving a gain control signal which controls a gain of the amplifier stage, and an output, the amplifier stage amplifying the input signal in accordance with the gain to generate the amplified signal at the output of the amplifier stage;

a peak detector having an input for receiving the input signal and an output, the peak detector generating a signal at the output of the peak detector that represents a peak amplitude of the input signal; and a gain control stage having an input coupled to the output of the peak detector, and an output coupled to the second input of the amplifier stage, the gain control stage generating the gain control signal based on the signal at the output of the peak detector; wherein the gain control stage further comprises:
an up/down counter responsive to the output of the peak detector, the up/down counter incrementing when the output of the peak detector is below a maximum permissible amplitude of the input signal for the gain of the amplifier stage, and decrementing when the output of the peak detector is above a maximum permissible input signal for the gain of the amplifier stage.

31. A system for generating an amplified signal comprising:
an amplifier stage having a first input for receiving an input signal, a second input for receiving a gain control signal which controls a gain of the amplifier stage, and an output, the amplifier stage amplifying the input signal in accordance with the gain to generate the amplified signal at the amplifier stage output;

a peak detector having an input for receiving the input signal, and an output, the peak detector generating a signal at the peak detector output that represents an amplitude of the input signal; and means, coupled to the output of the peak detector, for generating the gain control signal based upon the signal at the output of the peak detector: wherein the means for generating includes means for comparing the signal at the output of the peak detector with a maximum permissible amplitude of the input signal corresponding to the gain of the amplifier stage.

32. The system according to claim 31, wherein the means for generating includes means tier increasing the gain when the signal at the output of the peak detector is less than the maximum permissible amplitude of the input signal, and decreasing the gain when the signal at the output of the peak detector is greater than the maximum permissible amplitude of the input signal.

33. The system according to claim 31, wherein the means for generating includes means for storing a plurality of maximum permissible amplitudes of the input signal, each of the plurality of maximum permissible amplitudes of the input signal corresponding to a particular gain of the amplifier stage.

* * * * *